United States Patent
Komijani et al.

(10) Patent No.: US 12,184,232 B2
(45) Date of Patent: Dec. 31, 2024

(54) WIDEBAND VOLTAGE-CONTROLLED OSCILLATOR CIRCUITRY

(71) Applicant: Apple Inc., Cupertino, CA (US)

(72) Inventors: Abbas Komijani, Mountain View, CA (US); Hongrui Wang, San Jose, CA (US); Sohrab Emami-Neyestanak, Pasadena, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/359,593

(22) Filed: Jul. 26, 2023

(65) Prior Publication Data

US 2024/0022209 A1 Jan. 18, 2024

Related U.S. Application Data

(63) Continuation of application No. 17/900,714, filed on Aug. 31, 2022, now Pat. No. 11,757,407, which is a
(Continued)

(51) Int. Cl.
  *H03B 5/12* (2006.01)
  *H03B 5/04* (2006.01)
  (Continued)

(52) U.S. Cl.
  CPC ............. *H03B 5/1228* (2013.01); *H03B 5/04* (2013.01); *H03B 5/1212* (2013.01);
  (Continued)

(58) Field of Classification Search
  CPC ...... H03B 5/1228; H03B 5/04; H03B 5/1212; H03B 5/1243; H03B 5/1265; H03B 5/1271; H03L 7/0891; H03L 7/097; H03L 7/099
  (Continued)

(56) References Cited

U.S. PATENT DOCUMENTS 7,592,875 B2    9/2009  Maget et al.
8,169,271 B2    5/2012  Goyal et al.
(Continued)

FOREIGN PATENT DOCUMENTS

KR    20180050210 A    5/2018
KR    20180059721 A    6/2018
WO     2009145686 A1   12/2009

*Primary Examiner* — Arnold M Kinkead
(74) *Attorney, Agent, or Firm* — Treyz Law Group, P.C.; Michael H. Lyons

(57) ABSTRACT

An electronic device may include a transceiver with mixer circuitry that up-converts or down-converts signals based on a voltage-controlled oscillator (VCO) signal. The transceiver circuitry may include first, second, third, and fourth VCOs. Each VCO may include a VCO core that receives a control voltage and an inductor coupled to the VCO core. Fixed linear capacitors may be coupled between the VCO cores. A switching network may be coupled between the VCOs. Control circuitry may place the VCO circuitry in one of four different operating modes and may switch between the operating modes to selectively control current direction in each of the inductors. The VCO circuitry may generate the VCO signal within a respective frequency range in each of the operating modes. The VCO circuitry may exhibit a relatively wide frequency range across all of the operating modes while introducing minimal phase noise to the system.

20 Claims, 10 Drawing Sheets

Related U.S. Application Data continuation of application No. 17/516,532, filed on Nov. 1, 2021, now abandoned, which is a continuation of application No. 17/131,168, filed on Dec. 22, 2020, now Pat. No. 11,165,389.

(51) Int. Cl.

| | | |
|---|---|---|
| *H03L 7/089* | (2006.01) | |
| *H03L 7/097* | (2006.01) | |
| *H03L 7/099* | (2006.01) | |

(52) U.S. Cl.
CPC ......... *H03B 5/1243* (2013.01); *H03B 5/1265* (2013.01); *H03B 5/1271* (2013.01); *H03L 7/0891* (2013.01); *H03L 7/097* (2013.01); *H03L 7/099* (2013.01)

(58) Field of Classification Search
USPC ........................................ 331/167, 117 FE, 2
See application file for complete search history.

(56) References Cited

U.S. PATENT DOCUMENTS

| | | |
|---|---|---|
| 8,264,293 B2 | 9/2012 | Yun et al. |
| 8,294,528 B2 | 10/2012 | Li et al. |
| 8,698,565 B2 | 4/2014 | Obkircher et al. |
| 8,836,443 B2 | 9/2014 | Ding et al. |
| 9,698,797 B1 | 7/2017 | Gulati et al. |
| 9,762,181 B2 | 9/2017 | Jajoo et al. |
| 10,804,846 B2 | 10/2020 | Zhang |
| 2015/0372664 A1 | 12/2015 | Walker et al. |
| 2016/0373057 A1* | 12/2016 | Farazian ................ H03B 27/00 |
| 2020/0295765 A1 | 9/2020 | Agrawal et al. |
| 2022/0200529 A1 | 6/2022 | Komijani et al. |

\* cited by examiner

WIDEBAND VOLTAGE-CONTROLLED OSCILLATOR CIRCUITRY

This application is a continuation of U.S. patent Ser. No. 17/900,714, filed Aug. 31, 2022, which is a continuation of U.S. patent application Ser. No. 17/516,532, filed Nov. 1, 2021, which is a continuation of U.S. patent application Ser. No. 17/131,168, filed Dec. 22, 2020, now U.S. Pat. No. 11,165,389, each of which is hereby incorporated by reference herein in its entirety.

FIELD

This disclosure relates generally to electronic devices and, more particularly, to electronic devices with wireless circuitry.

BACKGROUND

Electronic devices are often provided with wireless communications capabilities. An electronic device with wireless communications capabilities has wireless communications circuitry with one or more antennas. Wireless transceiver circuitry in the wireless communications circuitry uses the antennas to transmit or receive radio-frequency signals.

Wireless transceiver circuitry typically includes a mixer for upconverting or downconverting input signals based on a local oscillator signal. The local oscillator signal is often produced using voltage-controlled oscillator circuitry. It can be challenging to design satisfactory voltage-controlled oscillator circuitry for an electronic device.

SUMMARY

An electronic device may include wireless circuitry. The wireless circuitry may include transceiver circuitry that conveys radio-frequency signals over an antenna. The transceiver circuitry may include mixer circuitry. The mixer circuitry may up-convert or down-convert signals for the transceiver based on a voltage-controlled oscillator (VCO) output signal. The transceiver circuitry may include VCO circuitry that generates the VCO output signal. The VCO circuitry may include first, second, third, and fourth VCOs. Each VCO may include a VCO core that receives a control voltage and an inductor coupled between first and second terminals of the VCO core. Fixed linear capacitors may be coupled between the VCO cores. A switching network may be coupled between the first, second, third, and fourth VCOs. The switching network may include, for example, butterfly switches coupled between different pairs of the VCO cores in parallel with the capacitors.

The electronic device may include control circuitry. The control circuitry may provide control signals to the switching network to place the VCO circuitry in one of four different operating modes. The control circuitry may switch between the operating modes to selectively control current direction in each of the inductors. The VCO circuitry may generate the VCO output signal within a respective frequency range in each of the operating modes. The VCO circuitry may exhibit a relatively wide frequency range across all of the operating modes while introducing minimal phase noise to the system.

An aspect of the disclosure provides voltage-controlled oscillator (VCO) circuitry. The VCO circuitry can have a plurality of VCOs including a first VCO having a first inductor, a second VCO having a second inductor, a third VCO having a third inductor, and a fourth VCO having a fourth inductor. The VCO circuitry can have a first pair of capacitors coupled between the first VCO and the second VCO. The VCO circuitry can have a second pair of capacitors coupled between the second VCO and the third VCO. The VCO circuitry can have a third pair of capacitors coupled between the third VCO and the fourth VCO. The VCO circuitry can have a fourth pair of capacitors coupled between the fourth VCO and the first VCO. The VCO circuitry can have a switching network communicatively coupled to the plurality of VCOs and configured to selectively control current direction in the first inductor, the second inductor, the third inductor, and the fourth inductor to generate VCO output signals in frequency ranges across at least four operating modes of the VCO circuitry.

An aspect of the disclosure provides voltage-controlled oscillator (VCO) circuitry. The VCO circuitry can include a first VCO having a first VCO core and a first inductor coupled to the first VCO core. The VCO circuitry can include a second VCO having a second VCO core and a second inductor coupled to the second VCO core. The VCO circuitry can include a first pair of fixed capacitors coupled between the first VCO core and the second VCO core. The VCO circuitry can include a first switching circuit coupled between the first VCO core and the second VC core in parallel with the first pair of fixed capacitors.

An aspect of the disclosure provides an electronic device. The electronic device can have baseband processor circuitry configured to generate baseband signals. The electronic device can have mixer circuitry configured to generate radio-frequency signals based on the baseband signals and a voltage-controlled oscillator (VCO) output signal. The electronic device can have an antenna configured to transmit the radio-frequency signals. The electronic device can have VCO circuitry configured to generate the VCO output signal. The VCO circuitry can have a first VCO core with first and second terminals. The VCO circuitry can have a first inductor coupled between the first and second terminals. The VCO circuitry can have a second VCO core with third and fourth terminals. The VCO circuitry can have a second inductor coupled between the third and fourth terminals. The VCO circuitry can have a first fixed capacitor that couples the first terminal to the fourth terminal. The VCO circuitry can have a second fixed capacitor that couples the second terminal to the third terminal. The VCO circuitry can have a switching circuit that couples the first and second terminals to the third and fourth terminals in parallel with the first and second fixed capacitors, where the switching circuit has first and second states, in the first state the switching circuit couples the first terminal to the fourth terminal and couples the second terminal to the third terminal, and in the second state the switching circuit couples the first terminal to the third terminal and couples the second terminal to the fourth terminal in the second state.

DETAILED DESCRIPTION

Figure 1:
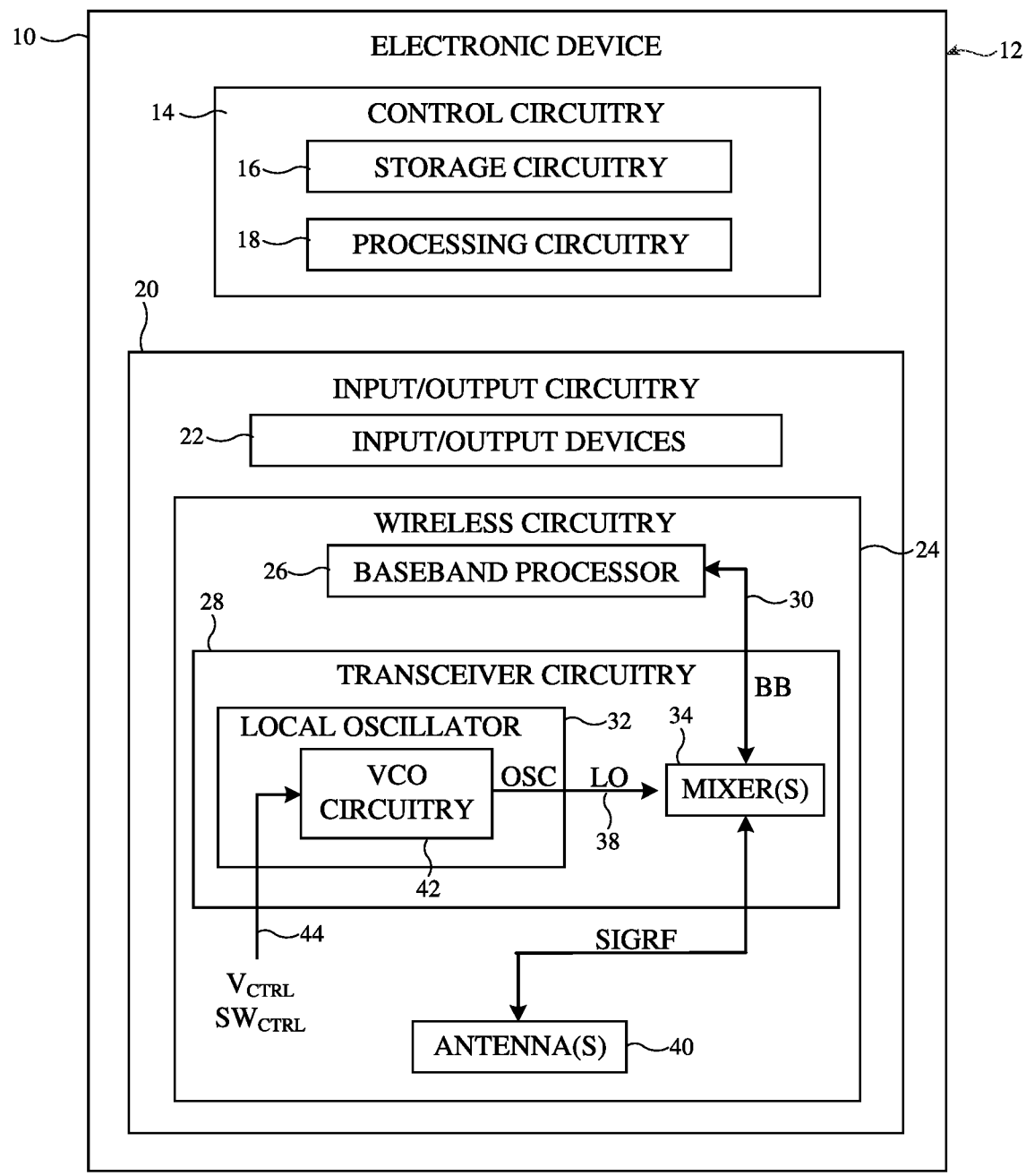
FIG. 1 is a functional block diagram of an illustrative electronic device having a transceiver with voltage-controlled oscillator (VCO) circuitry in accordance with some embodiments.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas 40. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using antenna(s) 40.

For example, as shown in FIG. 1, wireless circuitry 24 may include radio-frequency transceiver circuitry such as transceiver circuitry 28 that transmits and/or receives radio-frequency signals within a corresponding frequency band at radio frequencies (sometimes referred to herein as a communications band or simply as a "band"). For example, transceiver circuitry 28 may handle wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest. Transceiver circuitry 28 may sometimes be referred to herein as transceiver 28.

Transceiver circuitry 28 may be coupled to one or more antennas 40 over one or more radio-frequency transmission lines such as radio-frequency transmission line 36. Transmission lines in device 10 such as radio-frequency transmission line 36 may include coaxial cables, microstrip transmission lines, stripline transmission lines, edge-coupled microstrip transmission lines, edge-coupled stripline transmission lines, transmission lines formed from combinations of transmission lines of these types, etc. Antennas 40 may be formed using any desired antenna structures. For example, antennas 40 may include antennas with resonating elements that are formed from loop antenna structures, patch antenna structures, inverted-F antenna structures, slot antenna structures, planar inverted-F antenna structures, helical antenna structures, monopole antennas, dipoles, hybrids of these designs, etc. Filter circuitry, switching circuitry, impedance matching circuitry, and/or other antenna tuning components may be adjusted to adjust the frequency response and wireless performance of antennas 40 over time.

Wireless circuitry 24 may also include baseband processor circuitry such as baseband processor 26. Baseband processor 26 may be coupled to transceiver circuitry 28 over baseband path 30. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24, baseband processor 26, etc.).

The example of FIG. 1 is merely illustrative. In general, wireless circuitry 24 may include any desired number of baseband processors 26, any desired number of transceivers, and any desired number of antennas 40. Each baseband processor 26 may be coupled to one or more transceivers over respective baseband paths 30. Each transceiver may include transmitter circuitry that outputs uplink signals to antenna(s) 40 and/or may include receiver circuitry that receives downlink signals from antenna(s) 40. Each transceiver may be coupled to one or more antennas 40 over respective radio-frequency transmission lines 36. One or more of the radio-frequency transmission lines may have a radio-frequency front end module interposed thereon. The radio-frequency front end module may include radio-frequency front end components such as filters, switches, impedance matching circuitry, antenna tuning components, amplifier circuitry, radio-frequency couplers, sensors, etc., mounted to a common package, chip, or substrate.

In performing wireless transmission, baseband processor 26 may provide baseband signals BB to transceiver circuitry 28 over baseband path 30. Transceiver circuitry 28 may include circuitry for converting the baseband signals BB received from baseband processor 26 into corresponding radio-frequency signals. For example, transceiver circuitry 28 may include mixer circuitry such as one or more mixers 34 for up-converting (or modulating) baseband signals BB to radio frequencies prior to transmission over antenna(s) 40 (e.g., as radio-frequency signals SIGRF). Transceiver circuitry 28 may also include digital-to-analog converter (DAC) and/or analog-to-digital converter (ADC) circuitry for converting signals between digital and analog domains (not shown in FIG. 1 for the sake of clarity). Antenna(s) 40 may transmit radio-frequency signals SIGRF to external wireless equipment by radiating the radio-frequency signals into free space.

In performing wireless reception, antenna(s) 40 may receive radio-frequency signals SIGRF from the external wireless equipment. The received radio-frequency signals SIGRF may be conveyed to transceiver circuitry 28 via radio-frequency transmission line 36. Transceiver circuitry 28 may include circuitry for converting the received radio-frequency signals into corresponding baseband signals. For example, transceiver circuitry 28 may use one or more mixers 34 to down-convert (or demodulate) the received radio-frequency signals SIGRF to baseband frequencies prior to conveying the received signals to baseband processor 26 over baseband path 30 (e.g., as baseband signals BB).

In order to perform up-conversion, mixer(s) 34 may mix a local oscillator (LO) signal such as local oscillator signal LO received over path 38 with an input signal such as baseband signals BB. If desired, local oscillator signal LO may include multiple local oscillator signals that are provided to different mixers 34 for up-converting to different frequencies. For example, local oscillator signal LO may include a radio-frequency local oscillator (RFLO) signal for upconverting signals from baseband to radio frequencies or for upconverting signals from intermediate frequencies (IF) to radio frequencies (e.g., as radio-frequency signals SIGRF). In examples where intermediate frequencies are used, local oscillator signal LO may also include an intermediate frequency local oscillator (IFLO) signal for upconverting signals from baseband to the intermediate frequencies. In examples where the radio frequencies are greater than 10 GHz (e.g., more than 20 GHz, more than 30 GHz, etc.), the intermediate frequencies may be between about 100 MHz and 10 GHz, as an example. Use of intermediate frequencies in scenarios where the radio frequencies are greater than 10 GHz may allow the signals to be conveyed across relatively large distances within device 10 with minimal signal attenuation, as high frequencies such as frequencies over 10 GHz are particularly susceptible to attenuation. Similarly, in order to perform down-conversion, mixer(s) 34 may mix local oscillator signal LO with an input signal such as radio-frequency signals SIGRF to generate intermediate frequency signals or baseband signals BB.

Transceiver circuitry 28 may include local oscillator circuitry such as local oscillator 32 that produces local oscillator signals LO. In an implementation that is described herein as an example, local oscillator 32 may include voltage-controlled oscillator circuitry such as voltage-controlled oscillator (VCO) circuitry 42. VCO circuitry 42 may output periodic signals on path 38, sometimes referred to herein as VCO output signals OSC, based on a control voltage such as control voltage $V_{CTRL}$ received over control path 44 (e.g., from control circuitry 14). Local oscillator 32 may generate local oscillator signals LO based on VCO output signals OSC. For example, local oscillator 32 may include a phase-locked loop (PLL), digital flip-flops, buffer circuits, and/or any other desired circuitry (e.g., clocking circuitry) that produces local oscillator signals LO using the VCO output signals OSC generated by VCO circuitry 42. The example of FIG. 1 is merely illustrative. VCO circuitry 42 need not be formed as a part of local oscillator 32. In general, VCO output signals OSC may be used to perform any desired functions for device 10 that otherwise require VCO output signals such as VCO output signals OSC.

Control voltage $V_{CTRL}$ may be used to control the frequency of VCO output signals OSC and thus the frequency of local oscillator signals LO (e.g., for controlling mixer(s) 34 to down-convert or up-convert input signals to desired frequencies). In an implementation that is described herein as an example, VCO circuitry 42 includes multiple voltage-controlled oscillators (VCOs). Forming VCO circuitry 42 with multiple VCOs may serve to extend the total frequency range producible by mixer(s) 34 relative to scenarios where the VCO circuitry includes only a single VCO.

In some scenarios, switched capacitors (e.g., series-coupled switches and capacitors) are coupled between different pairs of the VCOs. However, in practice, the ratio $C_{ON}/C_{OFF}$ of the switched capacitors serves as a bottleneck for the frequency range producible by VCO circuitry 42. In addition, the switched capacitors may exhibit a relatively low Q-factor and can introduce undesirable phase noise into the system. In order to further extend the frequency range producible by VCO circuitry 42 while mitigating these issues, VCO circuitry 42 may be formed without switched capacitors between the VCOs. Instead, VCO circuitry 42 may include fixed linear capacitors and a separate, parallel-coupled, switching network coupled between the VCOs. Control circuitry 14 may provide switch control signals $SW_{CTRL}$ over control path 44 to control the state of the switching network. The state of the switching network may be controlled to place VCO circuitry 42 into one of multiple different operating modes. In an example where VCO circuitry 42 includes four VCOs, the switching network may be controlled to place VCO circuitry 42 into one of four different operating modes. Each operating mode may be associated with a different respective frequency range producible using VCO circuitry 42. Forming VCO circuitry 42 in this way may serve to maximize the frequency range producible using VCO circuitry 42. In addition, the fixed linear capacitors may exhibit greater linearity and greater Q-factor, thereby introducing less phase noise, than in scenarios where switched capacitors are coupled between the VCOs.

Figure 2:
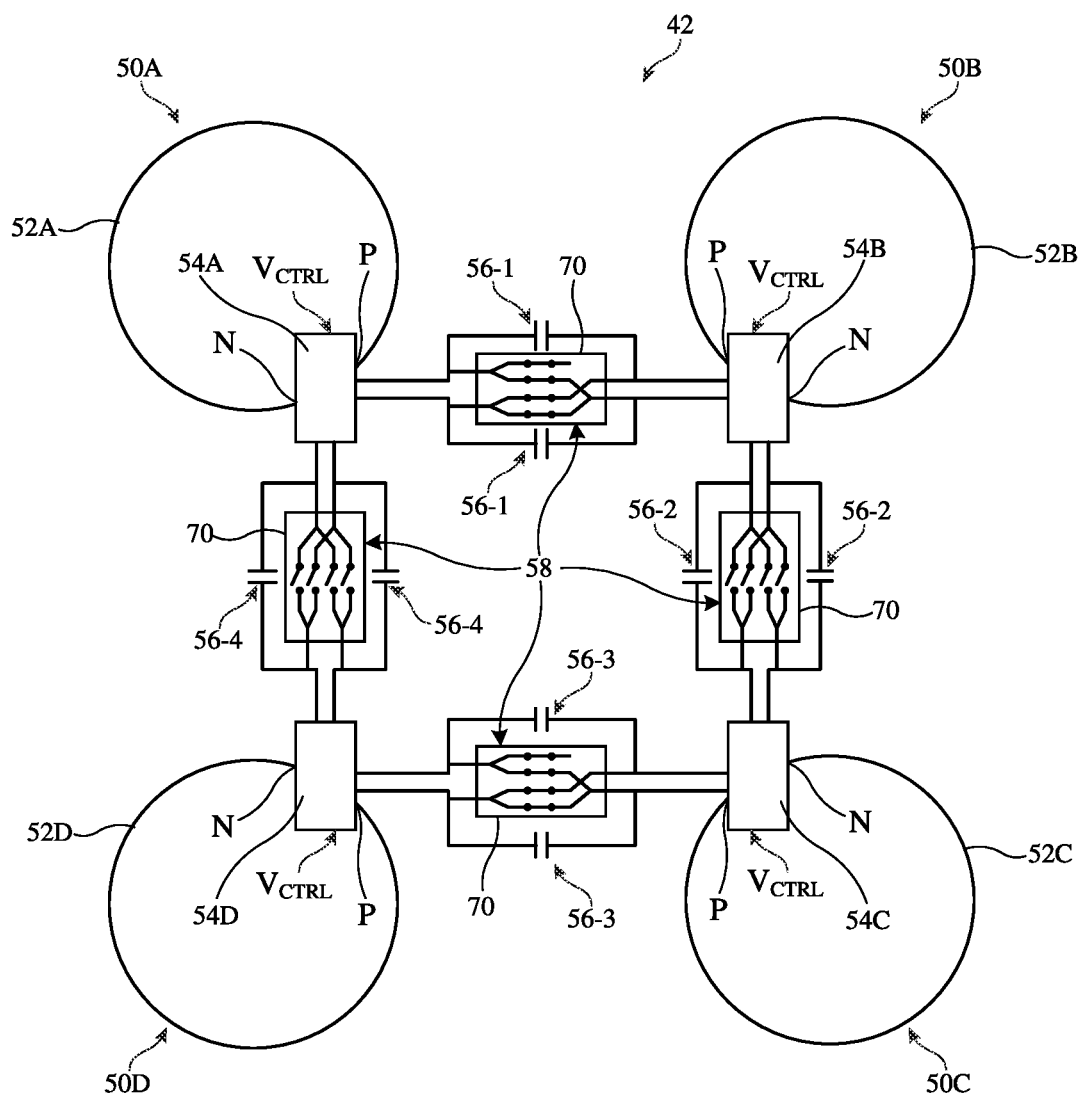
FIG. 2 is a diagram of illustrative VCO circuitry having multiple VCOs that are coupled together using fixed capacitors and a switching network for extending a frequency range of the VCO circuitry in accordance with some embodiments.

FIG. 2 is a diagram of VCO circuitry 42 in an example where VCO circuitry 42 includes four VCOs for producing VCO output signals OSC. This example is merely illustrative and, in general, VCO circuitry 42 may include two VCOs, six VCOs, more than six VCOs, or any other desired number of VCOs.

As shown in FIG. 2, VCO circuitry 42 may include four VCOs 50 such as a first VCO a second VCO 50B, a third VCO 50C, and a fourth VCO 50D. Each VCO 50 may be formed on a common substrate such as a flexible or rigid printed circuit board substrate. Each VCO 50 may include a corresponding VCO core 54 having a first terminal N and a second terminal P. VCO circuitry 42 may have tap points (output terminals) at each of the terminals N and P of VCO cores 54A, 54B, 54C, and 54D (e.g., for outputting VCO output signals OSC of FIG. 1). Each VCO core 54 may receive control voltage $V_{CTRL}$ for tuning the frequency of VCO output signals OSC. Terminals N and P may be, for example, respective negative and positive signal terminals of the VCO cores. In this example, VCO output signals OSC may be differential signals formed from a differential signal pair output that is output from VCO circuitry 42 at terminals N and P (e.g., where the differential signal pair includes a negative signal output at terminal N and a corresponding positive signal output at terminal P).

Each VCO 50 may also include a respective inductor 52 that is coupled between terminals N and P of the corresponding VCO core 54. Each inductor 52 can have one or more loops or coils of conductive material such as conductive traces on the underlying substrate. For example, VCO 50A may have an inductor 52A coupled between terminals N and P of VCO core 54A, VCO 50B may have an inductor 52B coupled between terminals N and P of VCO core 54B, VCO 50C may have inductor 52C coupled between terminals N and P of VCO core 54C, etc. Current may run around inductors 52 while VCO circuitry 42 generates VCO output signals OSC.

The VCO circuitry 42 can have capacitors 56 coupled between pairs of the VCOs 50. The capacitors 56 can be fixed linear capacitors. In some embodiments, the capacitors 56 can be variable capacitors. The capacitors 56 may be coupled in parallel between adjacent pairs of the VCOs 50 in VCO circuitry 42. For example, as shown in FIG. 2, a first pair of capacitors 56-1 may be coupled in parallel between VCOs 50A and 50B. Capacitors 56-1 may include a first capacitor coupled between terminal P on VCO core 54A and terminal P on VCO core 54B and may include a second capacitor coupled between terminal N on VCO core 54A and terminal N on VCO core 54B. In addition, a second pair of capacitors 56-2 may be coupled in parallel between VCOs 50B and 50C. Capacitors 56-2 may include a first capacitor coupled between terminal P on VCO core 54B and terminal P on VCO core 54C and may include a second capacitor coupled between terminal N on VCO core 54B and terminal N on VCO core 54C. Similarly, a third pair of capacitors 56-3 may be coupled in parallel between VCOs 50C and 50D. Capacitors 56-3 may include a first capacitor coupled between terminal P on VCO core 54C and terminal P on VCO core 54D and may include a second capacitor coupled between terminal N on VCO core 54C and terminal N on VCO core 54D. Finally, a fourth pair of capacitors 56-4 may be coupled in parallel between VCOs 50D and 50A. Capacitors 56-4 may include a first capacitor coupled between terminal P on VCO core 54D and terminal P on VCO core 54A and may include a second capacitor coupled between terminal N on VCO core 54D and terminal N on VCO core 54A. While each of the capacitors 56 in FIG. 2 are shown as a single capacitor, each of the capacitors 56 shown in FIG. 2 may include multiple fixed linear capacitors, if desired. Capacitors 56 may be formed as metal-oxide-metal (MOM) capacitors on the underlying substrate used to form VCO circuitry 42, if desired.

VCO circuitry 42 may also include switching circuitry such as switch network 58 coupled between each of the VCOs 50 in VCO circuitry 42. Switch network 58 may be coupled to terminals N and P of each of the VCO cores 54 in VCO circuitry 42. In an implementation that is described herein as an example, switch network 58 may include four switching circuits 70 (e.g., butterfly switches), where each switching circuit 70 is coupled between a respective pair of the VCOs 50 in VCO circuitry 42 in parallel with capacitors 56. For example, switch network 58 may include a switching circuit 70 (e.g., butterfly switch) coupled between terminals P and N on VCO cores 54A and 54B (e.g., in parallel with capacitors 56-1), a second switching circuit 70 coupled between terminals P and N on VCO cores 54B and 54C (e.g., in parallel with capacitors 56-2), a third switching circuit 70 coupled between terminals P and N on VCO cores 54C and 54D (e.g., in parallel with capacitors 56-3), and a fourth switching circuit 70 coupled between terminals P and N on VCO cores 54D and 54A (e.g., in parallel with capacitors 56-4).

Control circuitry 14 (FIG. 1) may provide switch control signal $SW_{CTRL}$ (FIG. 1) to switch network 58 to control the state of the switching circuits 70 (e.g., the butterfly switches) in switch network 58. The switching circuits 70 in switch network 58 may be adjusted to switch VCO circuitry 42 between different operating modes. In the example of FIG. 2, VCO circuitry 42 may have four different operating modes. This is merely illustrative and, in general, VCO circuitry 42 may have any desired number of operating modes. Each operating mode may be associated with a different respective frequency range for VCO output signals OSC and thus a different respective frequency range producible at mixer(s) 34 (e.g., using the local oscillator signals LO generated using VCO output signals OSC). Control circuitry 14 may place VCO circuitry 42 in a selected one of the four operating modes at a given time by controlling switch network 58 using switch control signal $SW_{CTRL}$. Control circuitry 14 may further tune the frequency produced by VCO circuitry 42 using the control voltage $V_{CTRL}$ provided to VCO cores 54. Interconnecting the VCOs 50 in VCO circuitry 42 using fixed linear capacitors such as capacitors 56 and a parallel-coupled switch network such as switch network 58 may serve to maximize the frequency range producible using VCO circuitry 42, while also minimizing phase noise due to the high Q-factor and linearity of capacitors 56.

Figure 3:
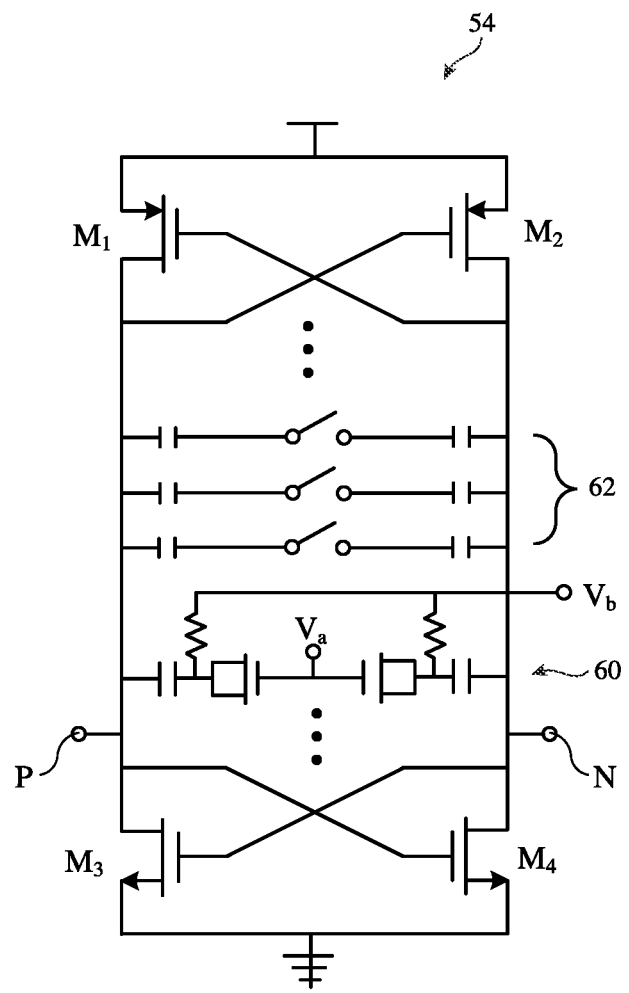
FIG. 3 is a circuit diagram of an illustrative VCO core in accordance with some embodiments.

FIG. 3 is a circuit diagram of a given VCO core 54 in one exemplary implementation. VCO core 54 of FIG. 3 may be used to form one, more than one, or each of the VCO cores 54A, 54B, 54C, and 54D in VCO circuitry 42. As shown in FIG. 3, VCO core 54 may have a first set of cross-coupled transistors $M_1$ and $M_2$ and a second set of cross-coupled transistors $M_3$ and $M_4$ coupled between terminals P and N. VCO core 54 may also have one or more varactors such as varactor 60 coupled between terminals P and N in parallel with the cross-coupled transistors. In addition, one or more switched capacitors 62 may be coupled in parallel between terminals P and N (e.g., in parallel with the cross-coupled transistors and varactor 60). Each switched capacitor 62 may include one or more capacitors coupled in series with a switch.

Control voltage $V_{CTRL}$ (FIGS. 1 and 2) may include control voltages $V_a$ and $V_b$ provided to varactor 60, as well as control signals for controlling the switches in switched capacitors 62. The VCO output signals OSC produced by the corresponding VCO 50 may be output at tap points coupled to terminals P and N (e.g., as a differential signal pair). Control circuitry 14 may control (fine-tune) the frequency of the VCO output signals OSC produced on terminals P and N using control voltages $V_a$ and $V_b$ as well as using the control signals that control the switches in switched capacitors 62. The example of FIG. 3 is merely illustrative and, in general, VCO core 54 may be implemented using any desired VCO core architecture.

Figure 4:
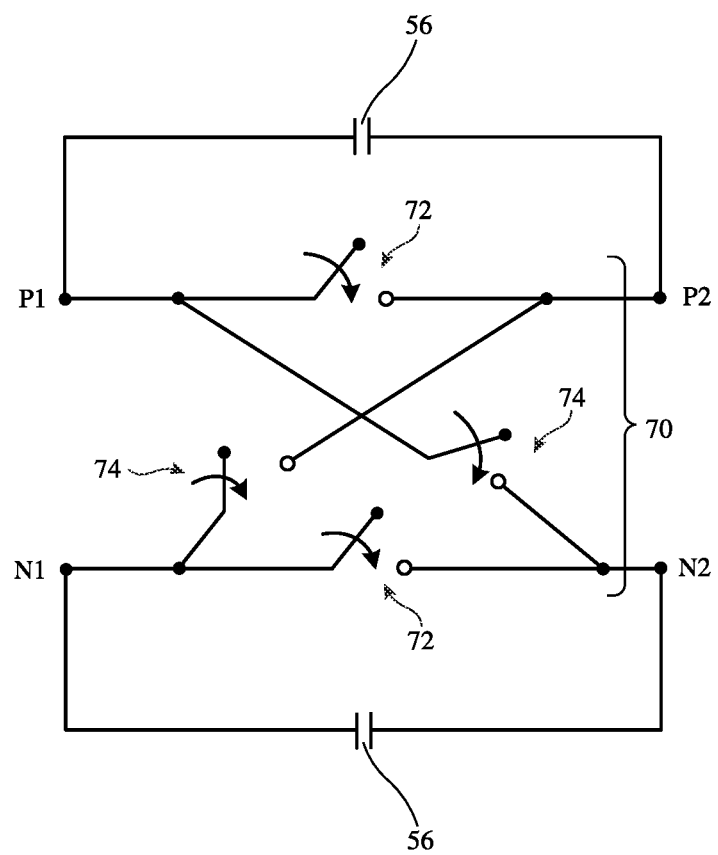
FIG. 4 is a circuit diagram of an illustrative butterfly switch that may be formed in a switching network coupled between VCOs in accordance with some embodiments.

FIG. 4 is a circuit diagram of a given switching circuit 70 in switch network 58 of FIG. 2. Switching circuit 70 may be, for example, a butterfly switch. Switching circuit 70 may therefore sometimes be referred to herein as butterfly switch 70. Switching circuit 70 may be used to couple terminals P and N of VCO core 54A to terminals P and N of VCO core 54B, to couple terminals P and N of VCO core 54B to terminals P and N of VCO core 54C, to couple terminals P and N of VCO core 54C to terminals P and N of VCO core 54D, or to couple terminals P and N of VCO core 54D to terminals P and N of VCO core 54A. In other words, switch network 58 may include four switching circuits 70 of FIG. 4, each coupled between a respective pair of adjacent VCO cores 54.

As shown in FIG. 4, switching circuit 70 may be coupled between terminals P1, P2, N1, and N2 in parallel with a pair of capacitors 56 (e.g., capacitors 56-1, 56-2, 56-3, or 56-4 of FIG. 2). For example, in scenarios where switching circuit 70 is used to couple terminals P and N of VCO core 54A to terminals P and N of VCO core 54B (e.g., in parallel with capacitors 56-1 of FIG. 2), terminal P1 forms terminal P of VCO core 54A, terminal P2 forms terminal P of VCO core 54B, terminal N1 forms terminal N of VCO core 54A, and terminal N2 forms terminal N of VCO core 54B. Similarly, in scenarios where switching circuit 70 is used to couple terminals P and N of VCO core 54B to terminals P and N of VCO core 54C (e.g., in parallel with capacitors 56-2 of FIG. 2), terminal P1 forms terminal P of VCO core 54B, terminal P2 forms terminal P of VCO core 54C, terminal N1 forms terminal N of VCO core 54B, and terminal N2 forms terminal N of VCO core 54C. In addition, in scenarios where switching circuit 70 is used to couple terminals P and N of VCO core 54C to terminals P and N of VCO core 54D (e.g., in parallel with capacitors 56-3 of FIG. 2), terminal P1 forms terminal P of VCO core 54C, terminal P2 forms terminal P of VCO core 54D, terminal N1 forms terminal N of VCO core 54C, and terminal N2 forms terminal N of VCO core 54D. Finally, in scenarios where switching circuit 70 is used to couple terminals P and N of VCO core 54D to terminals P and N of VCO core 54A (e.g., in parallel with capacitors 56-4 of FIG. 2), terminal P1 forms terminal P of VCO core 54D, terminal P2 forms terminal P of VCO core 54A, terminal N1 forms terminal N of VCO core 54D, and terminal N2 forms terminal N of VCO core 54A.

Switching circuit 70 may include a first switch 72 that couples terminal P1 to terminal P2 and a second switch 72 that couples terminal N1 to terminal N2 (e.g., in parallel with the first switch 72 and capacitors 56). Switching circuit 70 may also include crossed switches such as a first switch 74 that couples terminal P1 to terminal N2 and a second switch 74 that couples terminal N1 to terminal P2. Each switch 72 and each switch 74 may be a single-pole single-throw (SPST) switch, as one example. This is merely illustrative. In general, switches 72 and 74 may be formed using any type of switch architecture. Switching circuit 70 may include any desired number of switches arranged in other manners between terminals P1, P2, N1, and N2 if desired.

Switch control signal $SW_{CTRL}$ (FIG. 2) may control the states of switches 72 and 74. In an implementation that is described herein as an example, switching circuit 70 may have first and second states (sometimes referred to herein as first and second switching states). In the first state, switches 72 are closed and switches 74 are open, thereby coupling terminal P1 to terminal P2 and coupling terminal N1 to terminal N2 (e.g., while de-coupling terminal P1 from terminal N2 and de-coupling terminal N1 from terminal P2). In the second state, switches 74 are closed and switches 72 are open, thereby coupling terminal P1 to terminal N2 and coupling terminal N1 to terminal P2 (e.g., while de-coupling terminal P1 from terminal P2 and de-coupling terminal N1 from terminal N2).

When open, each switch 72 or 74 may form a very high impedance or very low transconductance $g_m$ through the switch (e.g., an impedance that exceeds a threshold impedance value or a transconductance that is less than a threshold transconductance value). When closed, each switch 72 or 74 may form a very low impedance or very high transconductance $g_m$ through the switch (e.g., an impedance that exceeds a threshold impedance value or a transconductance that is less than a threshold transconductance value). As an example, switches such as switches 72 and 74 may each be formed using transistors having source, drain, and gate terminals. Each switch may be closed or "turned on" by asserting a gate voltage provided to the gate terminal to provide an electrical connection between its source and drain terminals. Similarly, each switch may be opened or "turned off" by deasserting the gate voltage to provide electrical isolation between its source and drain terminals. Switching circuit 70 may selectively couple ports P1 and N1 to ports P2 and N2 without introducing loss or nonlinearity to the system. Switching circuit 70 may sometimes be referred to herein as phase swapper 70.

Figure 5:
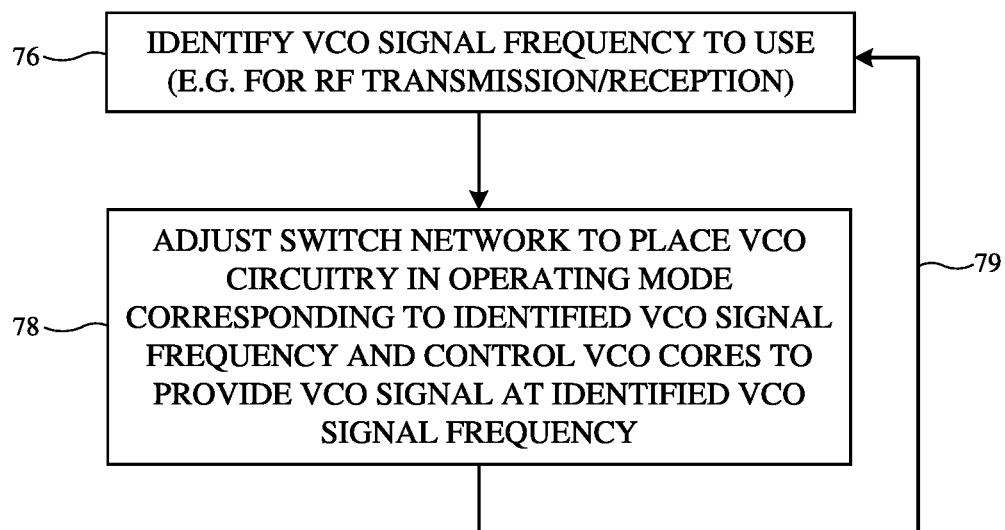
FIG. 5 is a flow chart of illustrative operations that may be performed in generating VCO output signals using VCO circuitry in accordance with some embodiments.

Each switching circuit 70 in switch network 58 (FIG. 2) may be placed in a selected one of the first and second states to place VCO circuitry 42 in a selected one of the first, second, third, or fourth operating modes. Control circuitry 14 may place VCO circuitry 42 in a selected one of the first, second, third, or fourth operating modes based on the frequency to be produced by mixer(s) 34. FIG. 5 is a flow chart of illustrative operations that may be performed by control circuitry 14 and VCO circuitry 42 to produce VCO output signals OSC of FIG. 1.

At operation 76, control circuitry 14 may identify a frequency for VCO output signal OSC. The frequency of VCO output signal OSC may, for example, be the VCO output signal frequency that corresponds to a desired radio, intermediate, or baseband frequency to be output by the mixer(s) 34 using VCO output signal OSC (e.g., when mixing an input signal with the local oscillator signal LO produced using VCO output signal OSC). The frequency for VCO output signal OSC may be identified using software running on control circuitry 14 and/or using control signals received from external communications circuitry such as a wireless access point or base station, as examples.

At operation 78, control circuitry 14 may place VCO circuitry 42 in a selected operating mode that corresponds to the identified frequency (e.g., a selected one of a first, second, third, or fourth operating mode, in which the identified frequency is producible using VCO circuitry 42). Control circuitry 14 may place VCO circuitry 42 in the selected operating mode using the control signals $SW_{CTRL}$ provided to switch network 58. Control circuitry 14 may, for example, place VCO circuitry 42 in the selected operating mode by placing each of the four switching circuits 70 in switch network 58 into a respective one of the first and second states (e.g., as described above in connection with FIG. 3).

In addition, VCO circuitry 42 may fine-tune the frequency produced by VCO circuitry 42 (e.g., within the frequency range associated with the selected operating mode) using the control voltage $V_{CTRL}$ provided to VCO cores 54. VCO circuitry 42 may generate corresponding VCO output signals OSC that are output over path 38 (FIG. 1). Mixer(s) 34 may use VCO output signals OSC (e.g., the local oscillator signals LO produced on path 38 using VCO output signals OSC) to down-convert or up-convert input signals to a frequency corresponding to the VCO output signal frequency identified while processing operation 76. Processing may subsequently loop back to operation 76 via path 79 to update the VCO output signal frequency as needed over time.

FIGS. 6-9 are diagrams depicting different operating modes of the VCO circuitry 42. For example, VCO circuitry 42 may be operated in each of the first, second, third, and fourth operating modes. In the example of FIGS. 6-9, switch network 58 (FIG. 2) includes a first switching circuit 70 (FIG. 4) coupled between VCOs 50A and 50B in parallel with capacitors 56-1, a second switching circuit 70 (FIG. 4) coupled between VCOs 50B and 50C in parallel with capacitors 56-2, a third switching circuit 70 (FIG. 4) coupled between VCOs 50C and 50D in parallel with capacitors 56-3, and a fourth switching circuit 70 (FIG. 4) coupled between VCOs 50D and 50A in parallel with capacitors 56-4. However, switch network 58 and its four switching circuits 70 are not illustrated in FIGS. 6-9 so as not to unnecessarily obscure the drawings.

In each of the first, second, third, and fourth operating modes, switch network 58 is adjusted to selectively control the direction of current on each of the inductors 52 of VCO circuitry 42 (e.g., so that the current flows in a clockwise or counterclockwise direction when viewed into the plane of the page). The direction of the current between adjacent VCOs 50 may cause some of the capacitors 56 to effectively appear invisible or visible to the system in each of the operating modes, which allows VCO circuitry 42 to produce VCO output signals OSC at frequencies that have a linear distribution across each of the four operating modes, with an extended frequency range across all four of the operating modes, and while introducing minimal phase noise. The capacitors 56 coupled between adjacent VCOs may effectively appear invisible to the system when the current in the adjacent VCOs flow in opposite directions (e.g., when the current and voltage distributions between the adjacent VCOs exhibit mirror symmetry about an axis extending perpendicularly between the adjacent VCOs). On the other hand, the capacitors 56 coupled between adjacent VCOs may effectively appear visible to the system when the current in the adjacent VCOs flow in the same direction (e.g., when the current and voltage distributions between the adjacent VCOs exhibit symmetry about the axis extending perpendicularly between the adjacent VCOs).

Figure 6:
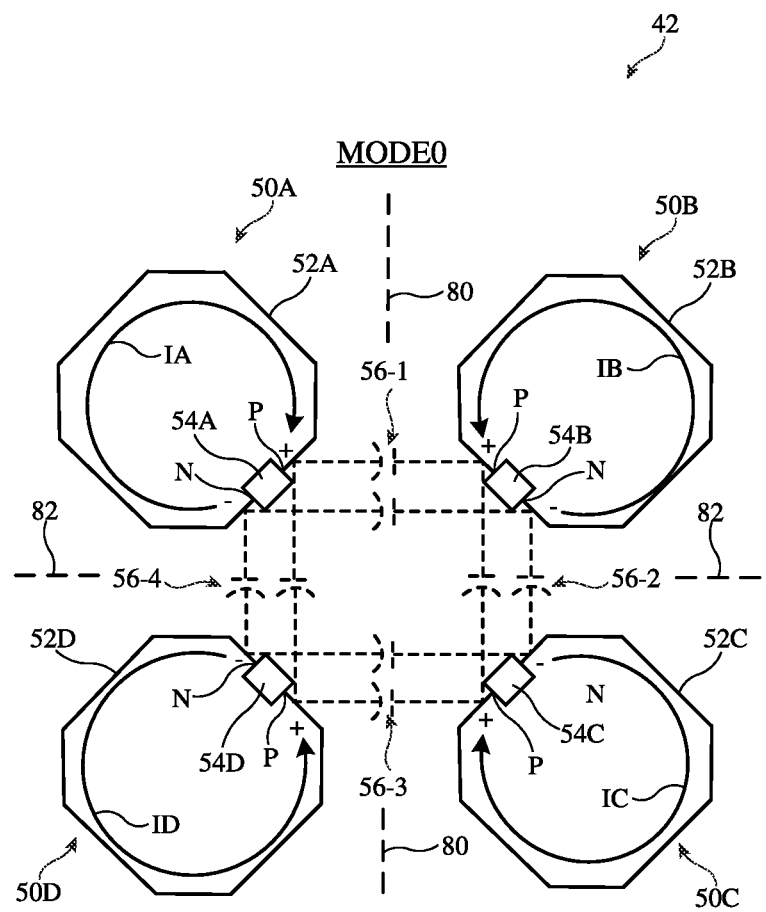
FIGS. 6-9 are diagrams showing how illustrative VCO circuitry may be used to generate VCO signals in respective first, second, third, and fourth operating modes in accordance with some embodiments.

FIG. 6 is a diagram showing how VCO circuitry 42 may be operated in the first operating mode. In the first operating mode (sometimes referred to herein as "MODE0"), VCO circuitry 42 may produce VCO output signals OSC within a first frequency range. Switch network 58 may be configured (using switch control signals $SW_{CTRL}$ of FIG. 2) so that the switching circuit 70 coupled between VCOs 50A and 50B, the switching circuit 70 coupled between VCOs 50B and 50C, the switching circuit 70 coupled between VCOs 50C and 50D, and the switching circuit 70 coupled between VCOs 50D and 50A are each in the first state (i.e., where switches 72 of FIG. 4 are closed and switches 74 of FIG. 4 are open).

Configuring switch network 58 in this way may cause the current in the inductor 52 of each VCO 50 to flow in a direction opposite to the direction of the current in the two adjacent VCOs 50. Each VCO 50 is adjacent to one VCO 50 about horizontal axis 82 and another VCO 50 about vertical axis 80. As shown in FIG. 6, current I will flow through each inductor 52 between terminals N and P of the corresponding VCO core 54 in a direction illustrated from "−" to "+." When in the first operating mode, switch network 58 configures the voltages at terminals P and N of VCO core 54A to vary directly with the voltages at terminals P and N of VCO core 54B, respectively (e.g., because the switches 72 in the switching circuit 70 coupled between VCOs 50A and 50B short the terminals P together and short the terminals N together). Equivalently, a current IA will flow from terminal N to terminal P of VCO core 54A (e.g., in a clockwise direction), whereas an opposite current IB will flow from terminal N to terminal P of VCO core 54B (e.g., in a counterclockwise direction). This current and voltage mirror symmetry between VCOs 50A and 50B about vertical axis 80 causes capacitors 56-1 (as well as the switches in the parallel-coupled switching circuit 70) to effectively appear invisible to the system.

Similarly, switch network 58 configures the voltages at terminals P and N of VCO core 54B to vary directly with the voltages at terminals P and N of VCO core 54C, respectively (e.g., because the switches 72 in the switching circuit 70 coupled between VCOs 50B and 50C short the terminals P together and short the terminals N together). Equivalently, a current IC will flow from terminal N to terminal P of VCO core 54C (e.g., in a clockwise direction), which is opposite the direction of the current IB in VCO 50B. This current and voltage mirror symmetry about horizontal axis 82 causes capacitors 56-2 (as well as the switches in the parallel-coupled switching circuit 70) to effectively appear invisible to the system.

In addition, switch network 58 configures the voltages at terminals P and N of VCO core 54C to vary directly with the voltages at terminals P and N of VCO core 54D, respectively (e.g., because the switches 72 in the switching circuit 70 coupled between VCOs 50C and 50D short the terminals P together and short the terminals N together). Equivalently, a current ID will flow from terminal N to terminal P of VCO core 54D (e.g., in a counterclockwise direction), which is opposite to the direction of the current IC in VCO 50C. This current and voltage mirror symmetry about vertical axis 80 causes capacitors 56-3 (as well as the switches in the parallel-coupled switching circuit 70) to effectively appear invisible to the system.

Finally, switch network 58 configures the voltages at terminals P and N of VCO core 54D to vary directly with the voltages at terminals P and N of VCO core 54A, respectively (e.g., because the switches 72 in the switching circuit 70 coupled between VCOs 50D and 50A short the terminals P together and short the terminals N together). Current ID thus flows in a direction opposite to the direction of the current IA in VCO 50A. This current and voltage mirror symmetry about horizontal axis 82 causes capacitors 56-4 (as well as the switches in the parallel-coupled switching circuit 70) to effectively appear invisible to the system. When configured in this way (in first operating mode MODE0), VCO circuitry 42 may output VCO output signals OSC within the first frequency range. The control voltage $V_{CTRL}$ provided to VCO cores 54 may further tune the frequency of VCO output signals OSC within the first frequency range.

Figure 7:
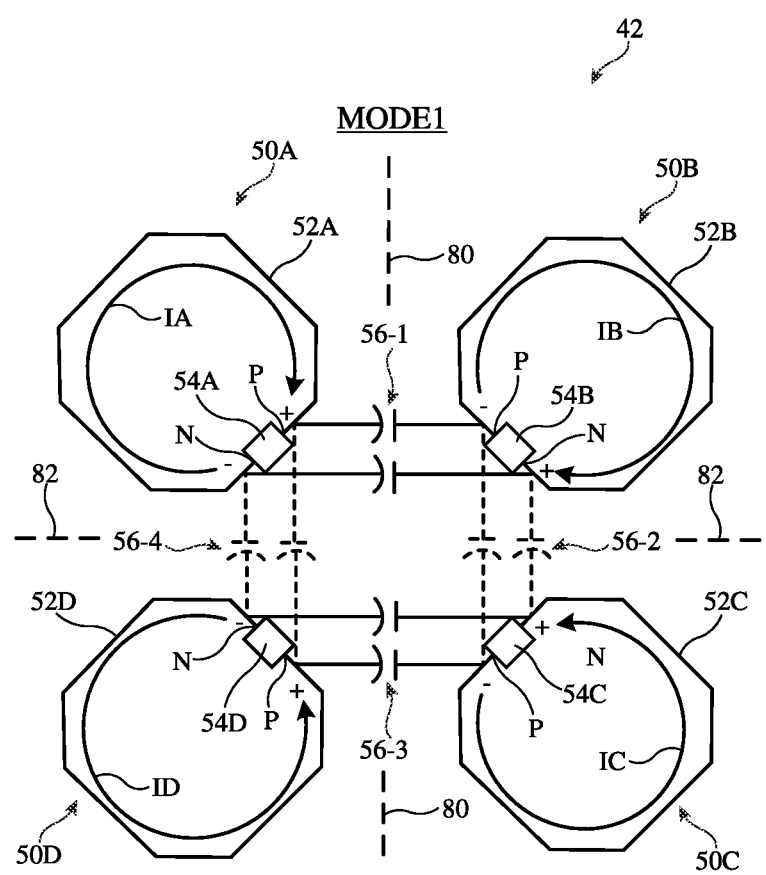

FIG. 7 is a diagram showing how VCO circuitry 42 may be operated in the second operating mode. In the second operating mode (sometimes referred to herein as "MODE1"), VCO circuitry 42 may produce VCO output signals OSC within a second frequency range (e.g., at lower frequencies than the first frequency range). Switch network 58 may be configured so that the switching circuit 70 coupled between VCOs 50A and 50B and the switching circuit 70 coupled between VCOs 50C and 50D are each in the second state (i.e., where switches 72 of FIG. 4 are open and switches 74 of FIG. 4 are closed). At the same time, switch network 58 may be configured so that the switching circuit 70 coupled between VCOs 50B and 50C and the switching circuit 70 coupled between VCOs 50D and 50A are each in the first state (i.e., where switches 72 of FIG. 4 are closed and switches 74 of FIG. 4 are open).

Configuring switch network 58 in this way may cause the current in the inductor 52 of each VCO 50 to flow in the same direction as the adjacent VCO 50 about vertical axis 80 but in the opposite direction as the adjacent VCO 50 about horizontal axis 82. For example, as shown in FIG. 7, switch network 58 configures the voltages at terminals P and N of VCO core 54A to vary oppositely (inversely) with the voltages at terminals P and N of VCO core 54B, respectively (e.g., because the switches 74 in the switching circuit 70 coupled between VCOs 50A and 50B short the terminal P in VCO 50A to the terminal N in VCO 50B and short the terminal N in VCO 50A to the terminal P in VCO 50B). Equivalently, current IA will flow from terminal N to terminal P of VCO core 54A (e.g., in a clockwise direction) while current IB flows in the same direction, from terminal P to terminal N of VCO core 54B (e.g., in the clockwise direction). This current and voltage symmetry between VCOs 50A and 50B about vertical axis 80 causes capacitors 56-1 to effectively appear visible to the system.

Similarly, switch network 58 configures the voltages at terminals P and N of VCO core 54C to vary oppositely (inversely) with the voltages at terminals P and N of VCO core 54BD, respectively (e.g., because the switches 74 in the switching circuit 70 coupled between VCOs 50C and 50D short the terminal P in VCO 50C to the terminal N in VCO 50D and short the terminal N in VCO 50C to the terminal P in VCO 50D). Equivalently, current IC will flow from terminal P to terminal N of VCO core 54C (e.g., in a counterclockwise direction) while current ID flows in the same direction, from terminal N to terminal P of VCO core 54B (e.g., in the counterclockwise direction). This current and voltage symmetry between VCOs 50C and 50D about vertical axis 80 causes capacitors 56-3 to effectively appear visible to the system.

At the same time, switch network 58 configures the voltages at terminals P and N of VCO core 54B to vary directly with the voltages at terminals P and N of VCO core 54C, respectively (e.g., because the switches 72 in the switching circuit 70 coupled between VCOs 50B and 50C short the terminals P together and short the terminals N together). Current IC thus flows in a direction opposite to the direction of the current IB in VCO 50B. This current and voltage mirror symmetry about horizontal axis 82 causes capacitors 56-2 (as well as the switches in the parallel-coupled switching circuit 70) to appear invisible to the system.

Similarly, switch network 58 configures the voltages at terminals P and N of VCO core 54D to vary directly with the voltages at terminals P and N of VCO core 54A, respectively (e.g., because the switches 72 in the switching circuit 70 coupled between VCOs 50D and 50A short the terminals P together and short the terminals N together). Current ID thus flows in a direction opposite the direction of current IA in VCO 50A. This current and voltage mirror symmetry about horizontal axis 82 causes capacitors 56-4 (as well as the switches in the parallel-coupled switching circuit 70) to appear invisible to the system. When configured in this way (in second operating mode MODE1), VCO circuitry 42 may output VCO output signals OSC within the second frequency range. The control voltage $V_{CTRL}$ provided to VCO cores 54 may further tune the frequency of VCO output signals OSC within the second frequency range.

Figure 8:
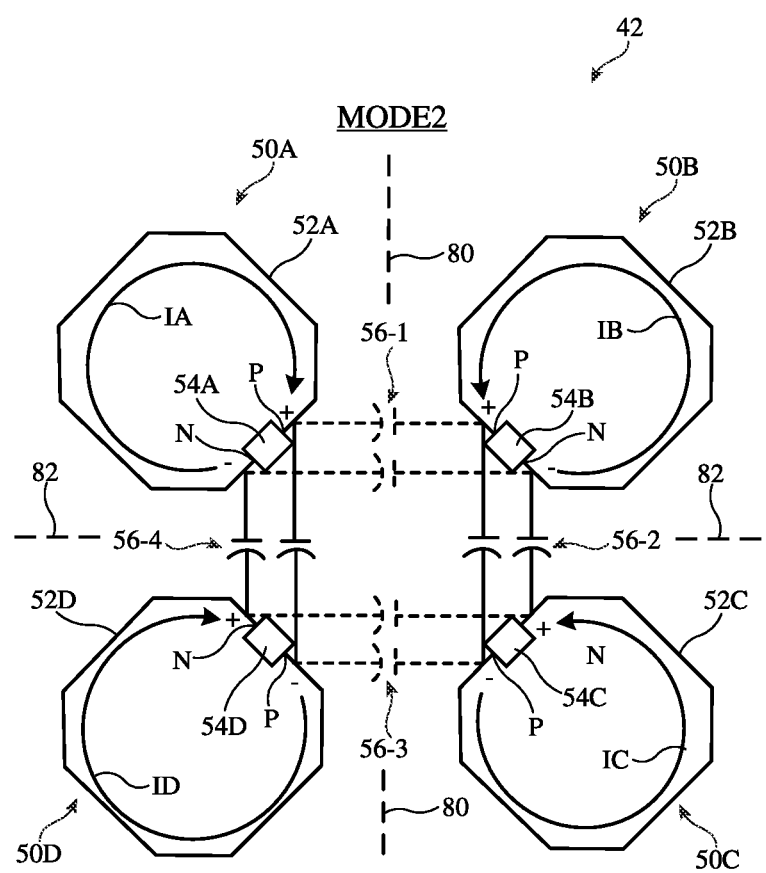

FIG. 8 is a diagram showing how VCO circuitry 42 may be operated in the third operating mode. In the third operating mode (sometimes referred to herein as "MODE2"), VCO circuitry 42 may produce VCO output signals OSC within a third frequency range (e.g., at lower frequencies than the second frequency range). Switch network 58 may be configured so that the switching circuit 70 coupled between VCOs 50A and 50B and the switching circuit 70 coupled between VCOs 50C and 50D are each in the first state (i.e., where switches 74 of FIG. 4 are open and switches 72 of FIG. 4 are closed). At the same time, switch network 58 may be configured so that the switching circuit 70 coupled between VCOs 50B and 50C and the switching circuit 70 coupled between VCOs 50D and 50A are each in the second state (i.e., where switches 72 of FIG. 4 are open and switches 74 of FIG. 4 are closed).

Configuring switch network 58 in this way may cause the current in the inductor 52 of each VCO 50 to flow in the same direction as the adjacent VCO 50 about horizontal axis 82 but in the opposite direction as the adjacent VCO 50 about vertical axis 80. For example, as shown in FIG. 8, switch network 58 configures the voltages at terminals P and N of VCO core 54B to vary oppositely (inversely) with the voltages at terminals P and N of VCO core 54C, respectively (e.g., because the switches 74 in the switching circuit 70 coupled between VCOs 50B and 50C short the terminal P in VCO 50B to the terminal N in VCO 50C and short the terminal N in VCO 50B to the terminal P in VCO 50C). Equivalently, current IB will flow from terminal N to terminal P of VCO core 54B (e.g., in a counterclockwise direction) while current IC flows in the same direction, from terminal P to terminal N of VCO core 54C (e.g., in the counterclockwise direction). This current and voltage symmetry between VCOs 50B and 50C about horizontal axis 82 causes capacitors 56-2 to effectively appear visible to the system.

Similarly, switch network 58 configures the voltages at terminals P and N of VCO core 54D to vary oppositely (inversely) with the voltages at terminals P and N of VCO core 54B A, respectively (e.g., because the switches 74 in the switching circuit 70 coupled between VCOs 50D and 50A short the terminal P in VCO 50D to the terminal N in VCO 50A and short the terminal N in VCO 50D to the terminal P in VCO 50A). Equivalently, current ID will flow from terminal P to terminal N of VCO core 54D (e.g., in a clockwise direction) while current IA flows in the same direction, from terminal N to terminal P of VCO core 54A (e.g., in the clockwise direction). This current and voltage symmetry between VCOs 50D and 50A about horizontal axis 82 causes capacitors 56-4 to effectively appear visible to the system.

At the same time, switch network 58 configures the voltages at terminals P and N of VCO core 54A to vary directly with the voltages at terminals P and N of VCO core 54B, respectively (e.g., because the switches 72 in the switching circuit 70 coupled between VCOs 50A and 50B short the terminals P together and short the terminals N together). Current IB thus flows in a direction opposite to the direction of the current IA in VCO 50A. This current and voltage mirror symmetry about vertical axis 80 causes capacitors 56-1 (as well as the switches in the parallel-coupled switching circuit 70) to appear invisible to the system.

Similarly, switch network 58 configures the voltages at terminals P and N of VCO core 54C to vary directly with the voltages at terminals P and N of VCO core 54D, respectively (e.g., because the switches 72 in the switching circuit 70 coupled between VCOs 50C and 50D short the terminals P together and short the terminals N together). Current ID thus flows in a direction opposite the direction of current IC in VCO 50C. This current and voltage mirror symmetry about vertical axis 80 causes capacitors 56-3 (as well as the switches in the parallel-coupled switching circuit 70) to appear invisible to the system. When configured in this way (in third operating mode MODE2), VCO circuitry 42 may output VCO output signals OSC within the third frequency range. The control voltage $V_{CTRL}$ provided to VCO cores 54 may further tune the frequency of VCO output signals OSC within the third frequency range.

Figure 9:
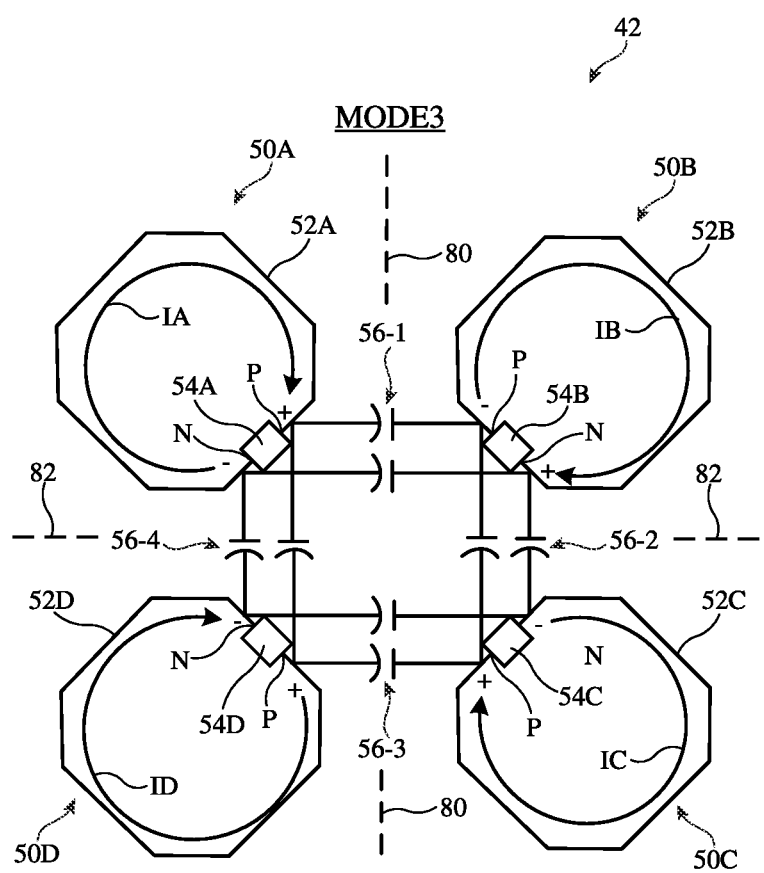

FIG. 9 is a diagram showing how VCO circuitry 42 may be operated in the fourth operating mode. In the third fourth mode (sometimes referred to herein as "MODE3"), VCO circuitry 42 may produce VCO output signals OSC within a fourth frequency range (e.g., at lower frequencies than the third frequency range). Switch network 58 may be configured so that the switching circuit 70 coupled between VCOs 50A and 50B, the switching circuit 70 coupled between VCOs 50C and 50D, the switching circuit 70 coupled between VCOs 50B and 50C, and the switching circuit 70 coupled between VCOs 50D and 50A are each in the second state (i.e., where switches 72 of FIG. 4 are open and switches 74 of FIG. 4 are closed).

Configuring switch network 58 in this way may cause the current in the inductor 52 of each VCO 50 to flow in the same direction as all of the other VCOs 50 in VCO circuitry 42. For example, as shown in FIG. 9, switch network 58 configures the voltages at terminals P and N of VCO core 54A to vary oppositely (inversely) with the voltages at terminals P and N of VCO core 54B, respectively (e.g., because the switches 74 in the switching circuit 70 coupled between VCOs 50A and 50B short the terminal P in VCO 50A to the terminal N in VCO 50B and short the terminal N in VCO 50A to the terminal P in VCO 50B). Equivalently, current IA will flow from terminal N to terminal P of VCO core 54A (e.g., in a clockwise direction) while current IB flows in the same direction, from terminal P to terminal N of VCO core 54B (e.g., in the clockwise direction). This current and voltage symmetry between VCOs 50A and 50B about vertical axis 80 causes capacitors 56-1 to effectively appear visible to the system.

Similarly, switch network 58 configures the voltages at terminals P and N of VCO core 54B to vary oppositely (inversely) with the voltages at terminals P and N of VCO core 54C, respectively (e.g., because the switches 74 in the switching circuit 70 coupled between VCOs 50B and 50C short the terminal P in VCO 50B to the terminal N in VCO 50C and short the terminal N in VCO 50B to the terminal P in VCO 50C). Equivalently, current IB will flow from terminal P to terminal N of VCO core 54B (e.g., in the clockwise direction) while current IC flows in the same direction, from terminal N to terminal P of VCO core 54C (e.g., in the clockwise direction). This current and voltage symmetry between VCOs 50B and 50C about horizontal axis 82 causes capacitors 56-2 to effectively appear visible to the system.

In addition, switch network 58 configures the voltages at terminals P and N of VCO core 54C to vary oppositely (inversely) with the voltages at terminals P and N of VCO core 54D, respectively (e.g., because the switches 74 in the switching circuit 70 coupled between VCOs 50C and 50D short the terminal P in VCO 50C to the terminal N in VCO 50D and short the terminal N in VCO 50C to the terminal P in VCO 50D). Equivalently, current IC will flow from terminal N to terminal P of VCO core 54C (e.g., in the clockwise direction) while current ID flows in the same direction, from terminal P to terminal N of VCO core 54D (e.g., in the clockwise direction). This current and voltage symmetry between VCOs 50C and 50D about vertical axis 80 causes capacitors 56-3 to effectively appear visible to the system.

Finally, switch network 58 also configures the voltages at terminals P and N of VCO core 54D to vary oppositely (inversely) with the voltages at terminals P and N of VCO core 54A, respectively (e.g., because the switches 74 in the switching circuit 70 coupled between VCOs 50D and 50A short the terminal P in VCO 50D to the terminal N in VCO 50A and short the terminal N in VCO 50D to the terminal P in VCO 50A). Current ID thus flows from terminal P to terminal N of VCO core 54D (e.g., in the clockwise direction) while current IA flows in the same direction, from terminal N to terminal P of VCO core 54A (e.g., in the clockwise direction). This current and voltage symmetry between VCOs 50D and 50A about horizontal axis 82 causes capacitors 56-4 to effectively appear visible to the system. When configured in this way (in fourth operating mode MODE3), VCO circuitry 42 may output VCO output signals OSC within the fourth frequency range. The control voltage $V_{CTRL}$ provided to VCO cores 54 may further tune the frequency of VCO output signals OSC within the third frequency range.

Figure 10:
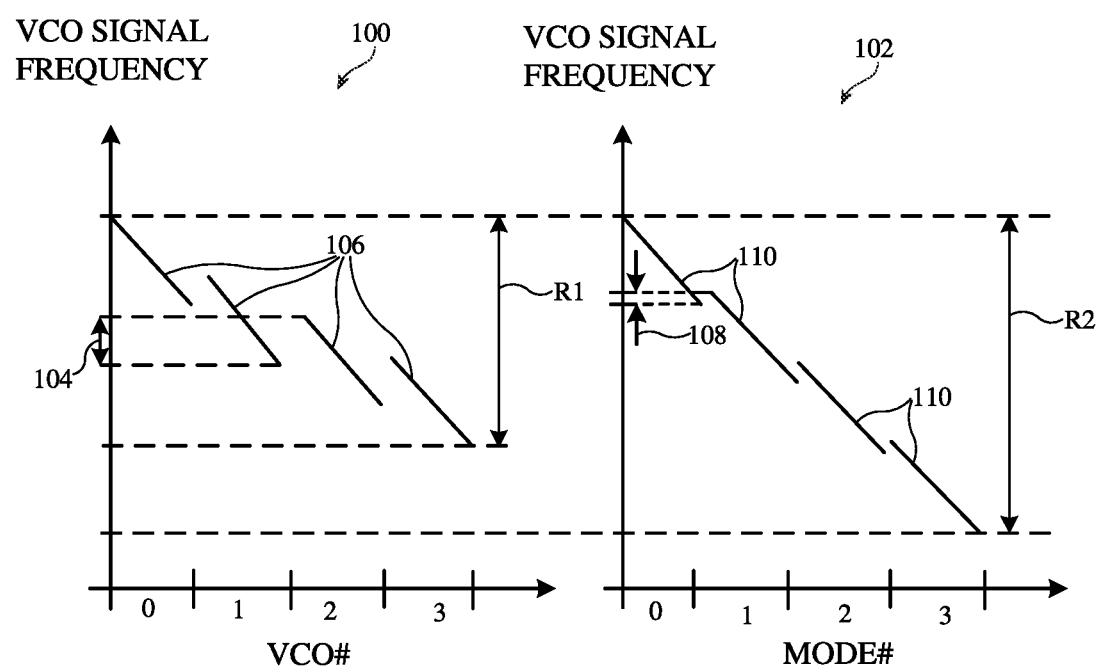
FIG. 10 is a plot showing how operating illustrative VCO circuitry in the first, second, third, and fourth operating modes of FIGS. 6-9 may serve to maximize the frequency range of the VCO circuitry in accordance with some embodiments.

FIG. 10 is a plot showing how operating VCO circuitry 42 in the first, second, third, and fourth operating modes of FIGS. 6-9 may serve to extend the frequency range of VCO circuitry 42. Plot 100 of FIG. 10 plots the frequency of the VCO output signals as a function of the active VCO in scenarios where switched capacitors are coupled between each of four VCOs and only one VCO is active at any given time for producing the VCO output signals. As shown by lines 106 of plot 100, each VCO may produce a corresponding frequency range, subject to a relatively large overlap 104 between each VCO. The presence of overlap 104 between each VCO may limit the overall frequency range across all four VCOs to overall frequency range R1.

Plot 102 of FIG. 10 plots the frequency of VCO output signals OSC as a function of the operating mode of VCO circuitry 42. As shown by lines 110 of plot 102, first operating mode MODE0 may produce a first frequency range, second operating mode MODE1 may produce a second frequency range that covers lower frequencies than the first frequency range, third operating mode MODE2 may produce a third frequency range that covers lower frequencies than the second frequency range, and fourth operating mode MODE3 may produce a fourth frequency range that covers lower frequencies than the third frequency range. Control circuitry 14 may tune the frequency of VCO output signals OSC within each frequency range using control voltage $V_{CTRL}$ (FIG. 2).

As shown by curves 110, the frequency response of VCO circuitry 42 is linear across all four operating modes, with an overlap 108 between each operating mode that is significantly smaller than the overlap 104 associated with plot 100. This may allow VCO circuitry 42 to exhibit a wider overall frequency range R2 across all four operating modes than the frequency range R1 associated with plot 100.

The examples of FIGS. 2-10 are merely illustrative. If desired, VCO circuitry 42 may have fewer than four operating modes (e.g., two or three operating modes), may have more than four operating modes (e.g., six or more operating modes), may include only two VCOs 50 that are coupled together by a single switching circuit 70 and a single pair of capacitors 56, or may include more than four VCOs 50. Inductors 52, which may sometimes be referred to herein as coils, may have an octagonal shape (e.g., as shown in FIGS. 2 and 6-9) or may have other shapes (e.g., a circular shape, an elliptical shape, or any other shape having any desired number of curved and/or straight segments).

The methods and operations described above in connection with FIGS. 1-10 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry 18 of FIG. 1, etc.). The processing circuitry may include microprocessors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. Clocking circuitry comprising:
   a first oscillator having a first terminal and a second terminal;
   a second oscillator having a third terminal and a fourth terminal;
   a third oscillator;
   a first switch that couples the first terminal to the fourth terminal;
   a second switch that couples the second terminal to the third terminal; and
   a third switch that couples the second terminal to the third oscillator.

2. The clocking circuitry of claim 1, further comprising:
   a fourth switch that couples the first terminal to the third terminal.

3. The clocking circuitry of claim 2, further comprising:
a fifth switch that couples the second terminal to the fourth terminal.

4. The clocking circuitry of claim 1, wherein the first oscillator comprises a first inductor coupled between the first terminal and the second terminal.

5. The clocking circuitry of claim 4, wherein the second oscillator comprises a second inductor coupled between the third terminal and the fourth terminal.

6. The clocking circuitry of claim 5, further comprising:
a fourth switch that couples the first terminal to the third terminal; and
a fifth switch that couples the second terminal to the fourth terminal.

7. The clocking circuitry of claim 1, wherein the first terminal comprises a positive terminal of the first oscillator, the second terminal comprises a negative terminal of the first oscillator, the third terminal comprises a positive terminal of the second oscillator, and the fourth terminal comprises a negative terminal of the second oscillator.

8. The clocking circuitry of claim 7, further comprising:
a fourth switch that couples the positive terminal of the first oscillator to the positive terminal of the second oscillator; and
a fifth switch that couples the negative terminal of the first oscillator to the negative terminal of the second oscillator.

9. The clocking circuitry of claim 1, further comprising:
a first capacitor that couples the first terminal to the third terminal.

10. The clocking circuitry of claim 9, further comprising:
a second capacitor that couples the second terminal to the fourth terminal.

11. The clocking circuitry of claim 10, further comprising:
a fourth switch that couples the first terminal to the third terminal; and
a fifth switch that couples the second terminal to the fourth terminal.

12. The clocking circuitry of claim 1, the first oscillator including a first voltage controlled oscillator (VCO) core having the first terminal and the second terminal and the second oscillator including a second VCO core having the third terminal and the fourth terminal.

13. The clocking circuitry of claim 12, the first oscillator including a first inductor coupled between the first terminal and the second terminal, and the second oscillator including a second inductor coupled between the third terminal and the fourth terminal.

14. The clocking circuitry of claim 1, wherein the third oscillator has a fifth terminal and a sixth terminal, the third switch couples the fifth terminal to the second terminal, and the clocking circuitry further comprises:
a fourth switch that couples the sixth terminal to the first terminal;
a fourth oscillator having a seventh terminal and an eighth terminal;
a fifth switch that couples the seventh terminal to the fourth terminal;
a sixth switch that couples the eighth terminal to the third terminal;
a seventh switch that couples the seventh terminal to the sixth terminal; and
an eighth switch that couples the eighth terminal to the fifth terminal.

15. Wireless circuitry comprising:
a first voltage controlled oscillator (VCO) having first terminals;
a second VCO having second terminals;
a first butterfly switch that couples the first terminals to the second terminals;
a third VCO having third terminals; and
a second butterfly switch that couples the third terminals to the first terminals.

16. The wireless circuitry of claim 15, further comprising:
a first conductive loop coupled between the first terminals; and
a second conductive loop coupled between the second terminals.

17. The wireless circuitry of claim 15, further comprising:
a fourth VCO having fourth terminals;
a third butterfly switch that couples the fourth terminals to the second terminals; and
a fourth butterfly switch that couples the fourth terminals to the third terminals.

18. An electronic device comprising:
one or more antennas configured to convey a radio-frequency signal;
a mixer configured to operate on the radio-frequency signal based on an oscillator signal; and
clocking circuitry configured to generate the oscillator signal, the clocking circuitry including
a first voltage controlled oscillator (VCO) core having a first positive terminal and a first negative terminal,
a first inductor coupled between the first positive terminal and the first negative terminal,
a second VCO core having a second positive terminal and a second negative terminal,
a second inductor coupled between the second positive terminal and the second negative terminal,
a first switch that couples the first positive terminal to the second positive terminal,
a second switch that couples the first positive terminal to the second negative terminal, and
a third VCO core coupled to the first VCO core by at least one switch.

19. The electronic device of claim 18, wherein the clocking circuitry further comprises:
a third switch that couples the first negative terminal to the second negative terminal; and
a fourth switch that couples the second positive terminal to the first negative terminal.

20. The electronic device of claim 18, wherein the third VCO core has a third positive terminal and a third negative terminal, the electronic device further comprising:
a third switch that couples the third positive terminal to the first negative terminal.

* * * * *